United States Patent
Nomura et al.

[11] Patent Number: 5,809,348
[45] Date of Patent: Sep. 15, 1998

[54] ZOOM COMPACT CAMERA

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 773,931

[22] Filed: Dec. 30, 1996

[30] Foreign Application Priority Data

Jan. 26, 1996 [JP] Japan .................................... 8-012317
Feb. 2, 1996 [JP] Japan .................................... 8-017876

[51] Int. Cl.⁶ .................................................. G03B 17/00
[52] U.S. Cl. ............................ 396/72; 396/529; 396/542
[58] Field of Search ............................. 396/72, 529, 542

[56] References Cited

U.S. PATENT DOCUMENTS

| | | | |
|---|---|---|---|
| Re. 34,453 | 11/1993 | Kamitani et al. | 396/72 |
| 4,806,961 | 2/1989 | Kamitani et al. | 396/85 |
| 5,043,752 | 8/1991 | Kohmoto | 396/72 |
| 5,051,764 | 9/1991 | Nomura et al. . | |
| 5,079,577 | 1/1992 | Nomura . | |
| 5,157,429 | 10/1992 | Haraguchi et al. . | |
| 5,231,449 | 7/1993 | Nomura . | |
| 5,245,476 | 9/1993 | Shono . | |
| 5,327,184 | 7/1994 | Nomura et al. . | |
| 5,349,475 | 9/1994 | Nomura et al. . | |
| 5,465,131 | 11/1995 | Haraguchi et al. . | |
| 5,485,315 | 1/1996 | Nomura et al. . | |
| 5,488,513 | 1/1996 | Tanaka . | |

Primary Examiner—Russell E. Adams
Attorney, Agent, or Firm—Greenblum & Bernstein, P.L.C.

[57] ABSTRACT

A zoom compact camera is provided with a stationary barrel portion and includes a movable barrel that houses a zoom lens. A linear guide groove is formed parallel to the optical axis on the stationary barrel portion. A guide key is provided on the movable barrel. The guide key slidably fits into the linear guide groove to guide the movable barrel. A code plate is fixed to an inner surface in the linear guide groove and a contacting terminal is securely fixed to the guide key to be in sliding contact with the code plate.

The focal length of the zoom lens is determined based on a signal indicating the relative position of the contacting terminal with respect to the code plate.

31 Claims, 18 Drawing Sheets

ZOOM COMPACT CAMERA

BACKGROUND OF THE INVENTION

The present invention relates to a zoom compact camera.

In a lens-shutter type of camera having a zooming function ("zoom compact camera"), a zoom lens barrel is advanced and retreated in the optical axis direction in response to operation of a zooming lever. The position of the zoom lens barrel is detected by the relative position of a contacting terminal that is in sliding contact with a code plate disposed in or on the lens barrel. The code plate is formed with a predetermined circuit pattern such that a particular signal is generated by the circuit for each contact position of the contacting terminal with the code plate.

In a conventional camera, the code plate is fixed on the zoom lens barrel and the contacting terminal is supported on a member which supports the zoom lens barrel.

However, with such a structure, the code plate and the contacting terminal require additional space to be installed, making it difficult to reduce the size of the zoom compact camera. Furthermore, depending on the method of installation and location of the code plate and the contacting terminal, the position of the contacting terminal and the code plate relative to each other may change during use and errors may arise in the detected focal length data.

SUMMARY OF THE INVENTION

It is therefore an object of the present invention to provide an improved zoom compact camera in which little extra space is used for a code plate and a contacting terminal and in which the code plate and the contacting terminal are held in a stable relationship with each other.

According to one aspect of the invention, there is provided a zoom compact camera that includes a stationary barrel portion, a movable barrel, a code plate, and a contacting terminal.

The stationary barrel portion is provided with a guide groove that is parallel to the optical axis and the code plate is fixed in the guide groove.

The movable barrel is provided with a guide key that slidably engages with the guide groove for guiding the movable barrel as the movable barrel moves. The contacting terminal is fixed to the guide key and is in slidable contact with the code plate.

In this way, a position of the movable barrel is detected based on a signal produced by the relative position of the contacting terminal with respect to the code plate.

In the above arrangement, the contacting terminal and the code plate are placed in a space that is used to guide the movement of the lens barrel relative to the stationary barrel portion, and thus, additional space does not need to be used in order to provide the contacting terminal and the code plate. Further, if the guide groove is positioned at or near a corner of a rectangular-shaped aperture of the camera, it makes use of otherwise unused space (i.e. "dead space") such that the size of the camera is reduced.

In a particular case, a zoom lens that has a front lens group and a rear lens group may be mounted on the movable barrel. Preferably, the rear lens group is movable, parallel to the optical axis, with respect to the front lens group. In this arrangement, the detected position of the movable barrel also determines a focal length of the zoom lens.

In another particular case, the guide key may include a protruding part that protrudes in the radial direction and has a fixing screw hole formed thereon. Further, the contacting terminal may include a brush part for making contact with the code plate and a connecting part that has a through hole, which corresponds with the fixing screw hole. The connecting part is connected to the protruding part of the guide key by a mounting screw. Thus, the position of the contacting terminal in relation to the protruding part is adjustable to ensure that the brush part remains in sliding contact with the code plate.

In this case, since the contacting terminal is securely fixed to the protruding part, and the protruding part is slidably fitted into the guide groove, the brush part of the contacting terminal is maintained in stable contact with the code plate, such that a position detection signal is stable. Further, the position of the contacting terminal in relation to the protruding part is easily adjustable.

In a further particular case, the stationary barrel portion is provided with a plurality of guide grooves and the movable barrel is provided with a plurality of guide keys that fit respectively with the plurality of guide grooves. In this case the code plate can be provided in one of the plurality of guide grooves and the contacting terminal can be fixed to a corresponding one of the plurality of guide keys. For example, the plurality of guide grooves can be arranged around said stationary barrel portion at equiangular intervals.

Preferably, the guide key is provided at a rear part of the movable barrel. In this way, the contacting terminal can be fixed to the guide key from the rear of the stationary barrel portion after the movable barrel is assembled with the stationary barrel portion.

Since the contacting terminal is fixed to the guide key from the rear after the major parts have been assembled onto the stationary barrel portion, there is less chance of erroneously bending or otherwise damaging the contacting terminal during assembly of other components.

Also preferably, the code plate is a part of a flexible printed circuit board, and a major portion of the flexible printed circuit board is provided on the outer side of the stationary barrel portion. As such, the size of the lens barrel or the stationary barrel portion can be reduced and the flexible printed circuit board can be further connected to at least one additional component, i.e. in addition to the code plate, for providing an electrical connection within the camera.

In a further particular case, the movable barrel may be a linear guide barrel and the camera may further include a first rotatable movable barrel, a second rotatable movable barrel, and a linearly movable barrel.

The first rotatable movable barrel is engaged with the stationary barrel portion and is coupled with the linear guide barrel at the inner side thereof in a manner enabling integral movement parallel to the optical axis and rotation relative to the linear guide barrel, such that, as the rotatable movable barrel rotates in a forward or in a reverse direction, the rotatable movable barrel and the linear guide barrel advance or retreat, respectively, parallel to the optical axis.

The second rotatable movable barrel is engaged at the inner side of the linear guide barrel such that, as the rotatable movable barrel rotates in the forward or in the reverse direction, the second rotatable movable barrel also rotates and moves parallel to the optical axis and, respectively, advances from or retreats into the linear guide barrel.

The linearly moving barrel is engaged at the inner side of the second rotatable movable barrel, such that, as the second rotatable movable barrel rotates in a forward or in a reverse direction, the linearly moving barrel moves parallel to the optical axis and, respectively, advances from or retreats into the second rotatable movable barrel.

Preferably, the guide key is provided at a rear part of the linear guide barrel. In this way, the contacting terminal can be fixed to the guide key from the rear of the stationary barrel portion after the linear guide barrel is assembled with the stationary barrel portion.

Since the contacting terminal is fixed to the guide key from the rear after the major parts have been assembled onto the stationary barrel portion, there is less chance of erroneously bending or otherwise damaging the contacting terminal during assembly of other components.

Again, preferably, the code plate is a part of a flexible printed circuit board, and the flexible printed circuit board is substantially provided on the outer side of the stationary barrel portion. In this way, the size of the lens barrel can be reduced and the flexible printed circuit can be further connected to at least one additional component, i.e. in addition to the code plate, for providing an electrical connection within the camera.

In the above aspects, the guide groove is preferably linear and open at at least one end for easy assembly of the guide key to the linear guide groove. Further, in a particular case the linear guide groove has a generally U-shaped cross-section and the code plate is fixed along the base region of the linear guide groove.

DETAILED DESCRIPTION OF THE PREFERRED EMBODIMENTS

A preferred embodiment of a zoom compact camera is described. A zoom compact camera is a lens-shutter type of camera having a zooming function.

Figure 11:
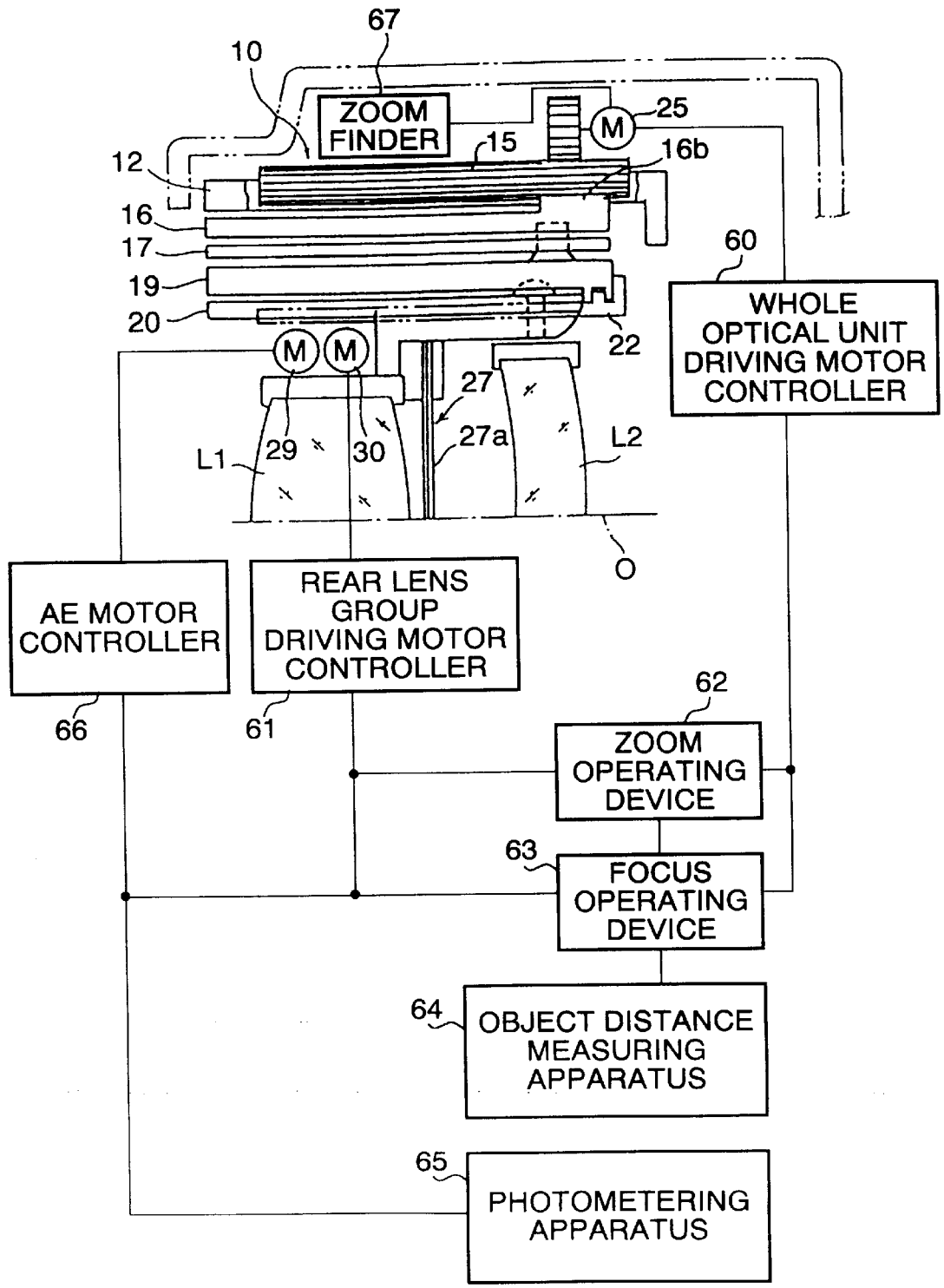
FIG. 11 is a block diagram of a controlling system for controlling an operation of the zoom lens barrel.

FIG. 11 is a schematic representation of various elements which comprise a zoom lens camera. The concept of the zoom lens camera will now be described with reference to FIG. 11.

The zoom lens camera is provided with a zoom lens barrel 10 of a three-stage delivery type having three movable barrels, namely a first movable barrel 20, a second movable barrel 19 and a third movable barrel 16, which are concentrically arranged in this order from an optical axis O. In the zoom lens barrel 10, two lens groups are provided, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, set by the operation of the zoom operating device 62, may be perceived by a value indicated on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. Due to the driving of the whole optical unit driving motor controller 60 and the rear lens group driving motor controller 61, the front and rear lens groups L1 and L2 are moved to respective positions corresponding to a set focal length and a detected object distance and thereby the zoom lens is focused on the object.

Specifically, the focus operating device 63 is provided with a release button (not shown) provided on an upper wall of the camera body. A photometering switch and a release switch (both not shown) are synchronized with the release button. When the release button is half-depressed (half step), the photometering switch is turned ON, and the object distance measuring and photometering commands are respectively input to the object distance measuring apparatus 64 and the photometering apparatus 65.

When the release button is fully depressed (full step), the release switch is turned ON, and according to the result of object distance measuring command and a set focal length, the whole optical unit driving motor 25 and the rear lens group driving motor 30 are driven, and the focusing operation, in which the front lens group L1 and the rear lens group L2 move to the focusing position, is executed. Further, an AE motor 29 of an AF/AE (i.e., autofocus/autoexposure) shutter unit 21 (FIG. 9) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole in the direction of the optical axis O (optical axis direction). Simultaneous with such a movement, the rear lens group driving motor 30 may also be driven via the rear lens group driving motor controller 61 to move the rear lens group L2 relative to the first lens group L1. However, this is not performed under the conventional concept of zooming, in which the focal length is varied sequentially while keeping an in-focus condition. When the zoom operating device 62 is operated, the front lens group L1 and the rear lens group L2 move in the optical axis direction, without varying the distance therebetween, by driving only the whole optical unit driving motor 25.

During the zooming operation, an in-focus condition cannot be obtained at all times with respect to an object located at a specific distance. However, this is not a problem in a lens-shutter type camera, since the image of the object is not observed through the photographing optical system, but through the finder optical system, that is provided separate from the photographing optical system, and it is sufficient that the in-focus condition is obtained when the shutter is released. Thus, when the release button is fully depressed, the focusing operation (focus adjusting operation) is carried out by moving at least one of the whole optical unit driving motor 25 and the rear lens group driving motor 30. In such a manner, since each of the two lens groups L1, L2 can be driven independently, when the focus operating device 63 is operated, the position of the lens groups L1, L2 can be flexibly controlled.

An embodiment of the zoom lens barrel according to the above concept will now be described with reference to mainly FIGS. 9 and 10.

The overall structure of the zoom lens barrel 10 will firstly be described.

The zoom lens barrel 10 is provided with the first movable barrel 20, the second movable barrel 19, the third movable barrel 16, and a fixed lens barrel block 12. The third movable barrel 16 is engaged with a cylindrical portion 12p of the fixed lens barrel block 12, and moves along the optical axis O upon being rotated. The third movable barrel 16 is provided on an inner periphery thereof with a linear guide barrel 17, which is restricted in rotation. The linear guide barrel 17 and the third movable barrel 16 move together as a whole along the optical axis O, with the third movable barrel 16 rotating relative to the linear guide barrel 17. The first movable barrel 20 moves along the optical axis O with rotation thereof being restricted. The second movable barrel 19 moves along the optical axis O, while rotating relative to the linear guide barrel 17 and the first movable barrel 20. The whole optical unit driving motor 25 is secured to the fixed lens barrel block 12. A shutter mounting stage 40 is secured to the first movable barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided, on an inner periphery of the cylindrical portion 12p thereof, with a female helicoid 12a, and also a plurality of linear guide grooves 12b each extending parallel to the optical axis O, i.e. extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 7:
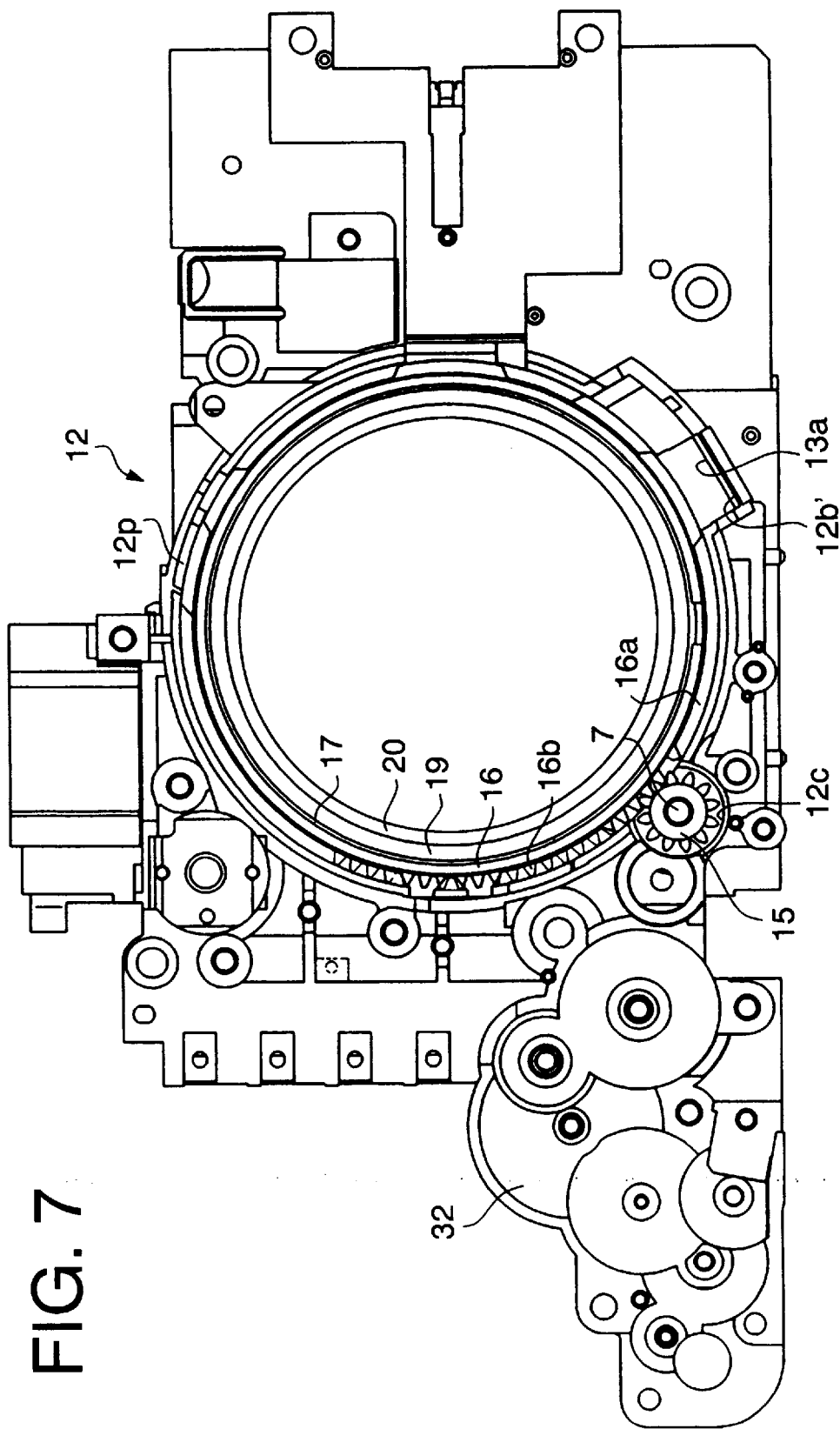
FIG. 7 is a front elevational view of a fixed lens barrel block of the zoom lens barrel.
Figure 10:
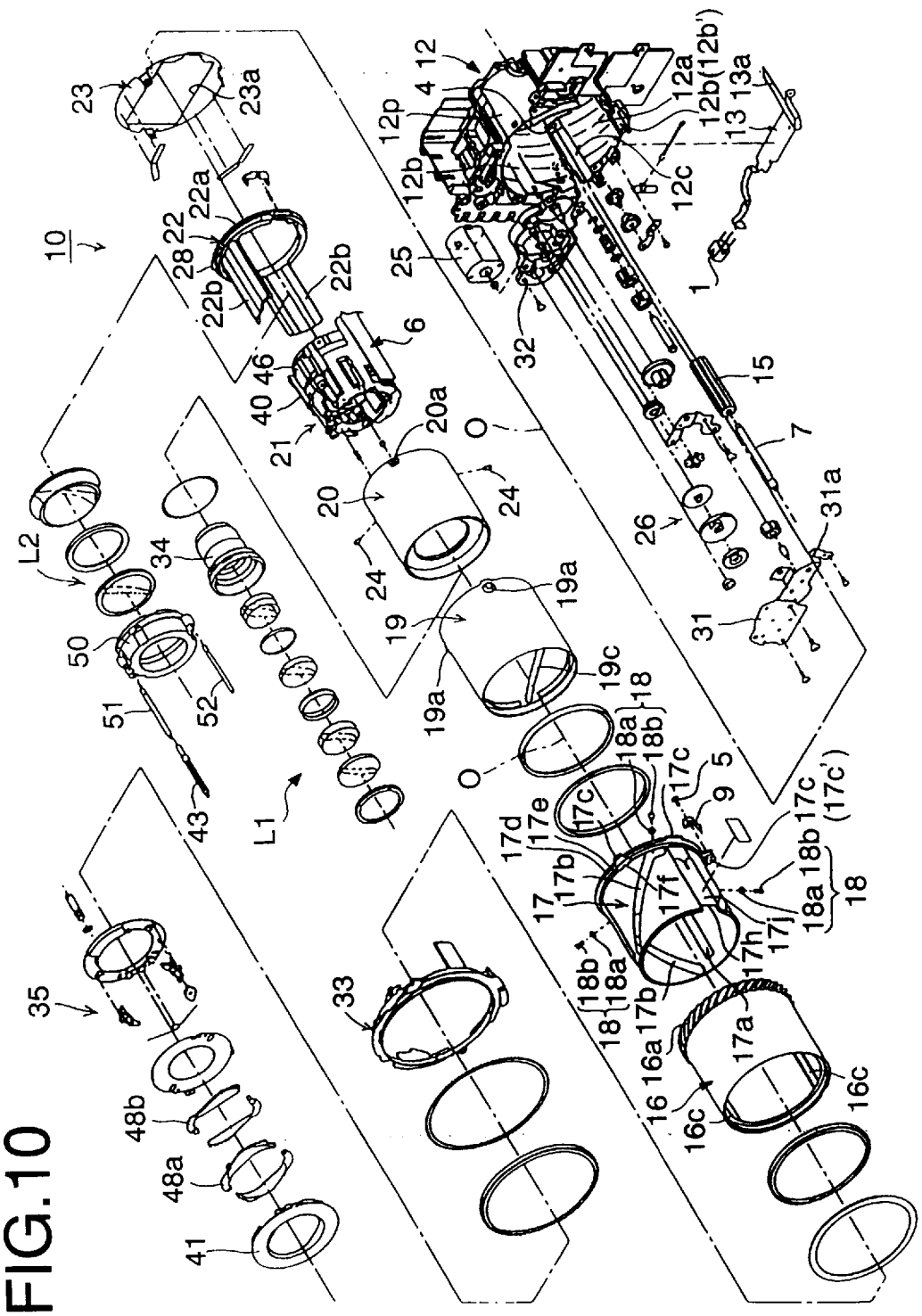
FIG. 10 is an exploded perspective view of the overall structure of the zoom lens barrel.

In the fixed lens barrel block 12, a gear housing 12c, which is recessed outwardly from an inner periphery of the cylindrical portion 12p of the fixed lens barrel block 12 in a radial direction while extending in the optical axis direction, is provided as shown in FIG. 7 or 10. In the gear housing 12c, a driving pinion 15, extending in the optical axis direction, is rotatably positioned. Both ends of an axial shaft 7 of the driving pinion 15 are rotatively supported, by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion of the fixed lens barrel block 12, so that the driving pinion 15 meshes with an outer peripheral gear 16b of the third movable barrel 16, as shown in FIG. 7.

Figure 6:
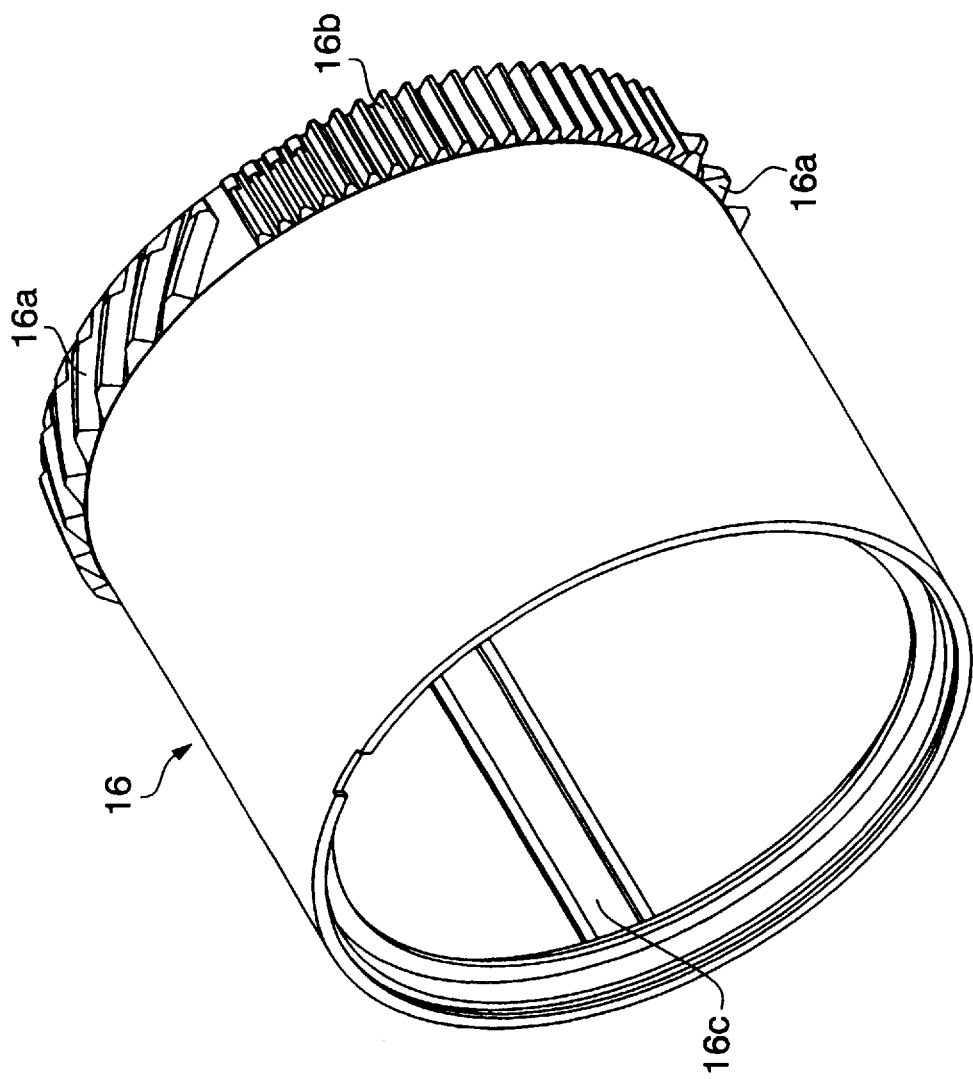
FIG. 6 is an external schematic perspective view of a third movable barrel of the zoom lens barrel.

On an inner periphery of the third movable barrel 16, a plurality of linear guide grooves 16c, each extending parallel to the optical axis O, are formed. At an outer periphery of the rear end of the third movable barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third movable barrel 16 in the optical axis direction.

As shown in FIG. 10, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided, in front of the rear end flange 17d, with an anti-dropping flange 17e. A circumferential groove 17g is formed between the rear end flange 17d and the anti-dropping flange 17e. The anti-dropping flange 17e has a radius smaller than the rear end flange 17d. The anti-dropping flange 17e is provided with a plurality of cutout portions 17f. Each of the cutout portions 17f allows a corresponding engaging projection 16d to be inserted into the circumferential groove 17g, as shown in FIG. 9.

The third movable barrel 16 is provided, on an inner periphery of the rear end thereof, with the plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (See FIG. 9) By rotating the third movable barrel 16 relative to the linear guide barrel 17, the engaging projections 16d are engaged with the linear guide barrel 17.

On the rear end of the linear guide barrel 17, an aperture plate 23 having a rectangular-shaped aperture 23a approximately the same shape as the aperture 14a, is fixed.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, namely 17c'. The contacting terminal 9 is in slidable contact with the code plate 13a, fixed to the bottom of the linear guide groove 12b', to generate signals corresponding to focal length information during zooming.

On the inner periphery of the linear guide barrel 17 a plurality of linear guide grooves 17a are formed, each extending parallel to the optical axis O. A plurality of lead slots 17b are also formed on the linear guide barrel 17 as shown in FIG. 10. The lead slots 17b are each formed oblique (inclined) to the optical axis O.

The second movable barrel 19 engages with the inner periphery of the linear guide barrel 17. On the inner periphery of the second movable barrel 19, a plurality of lead grooves 19c are provided in a direction inclined oppositely to the lead slots 17b. On the outer periphery of the rear end of the second movable barrel 19 a plurality of follower projections 19a are provided. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third movable barrel 16. With such an arrangement, when the third movable barrel 16 rotates, the second movable barrel 19 moves linearly in the optical axis direction, while rotating.

On the inner periphery of the second movable barrel 19, the first movable barrel 20 is engaged. The first movable barrel 20 is provided, on an outer periphery of the rear thereof, with a plurality of follower pins 24 each engaging with the corresponding inner lead groove 19c, and at the same time the first movable barrel 20 is guided linearly by a linear guide member 22. The first movable barrel 20 is provided at the front end thereof with a decorative plate 41.

Figure 1:
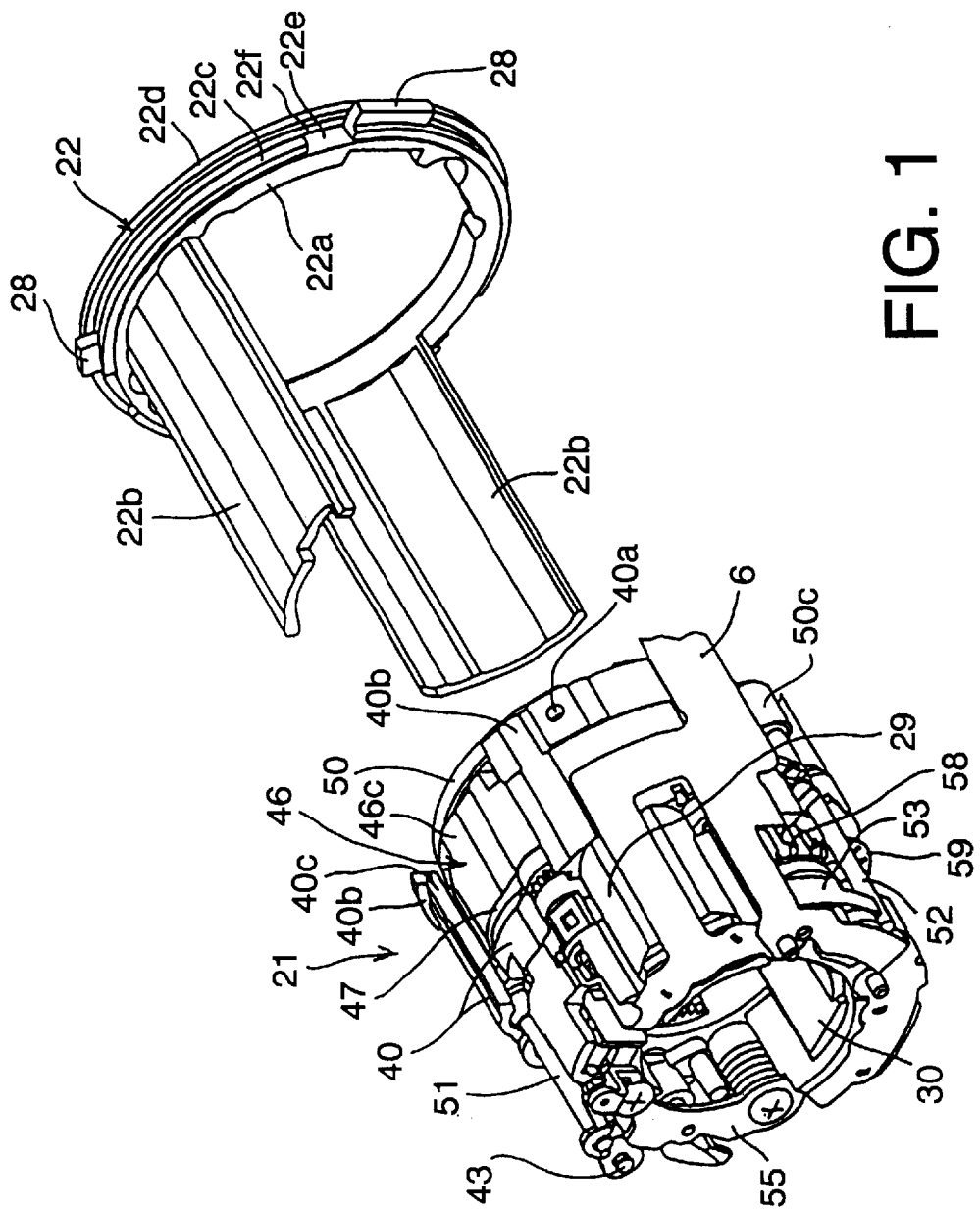
FIG. 1 is an enlarged schematic perspective view showing a part of a zoom lens barrel.
Figure 2:
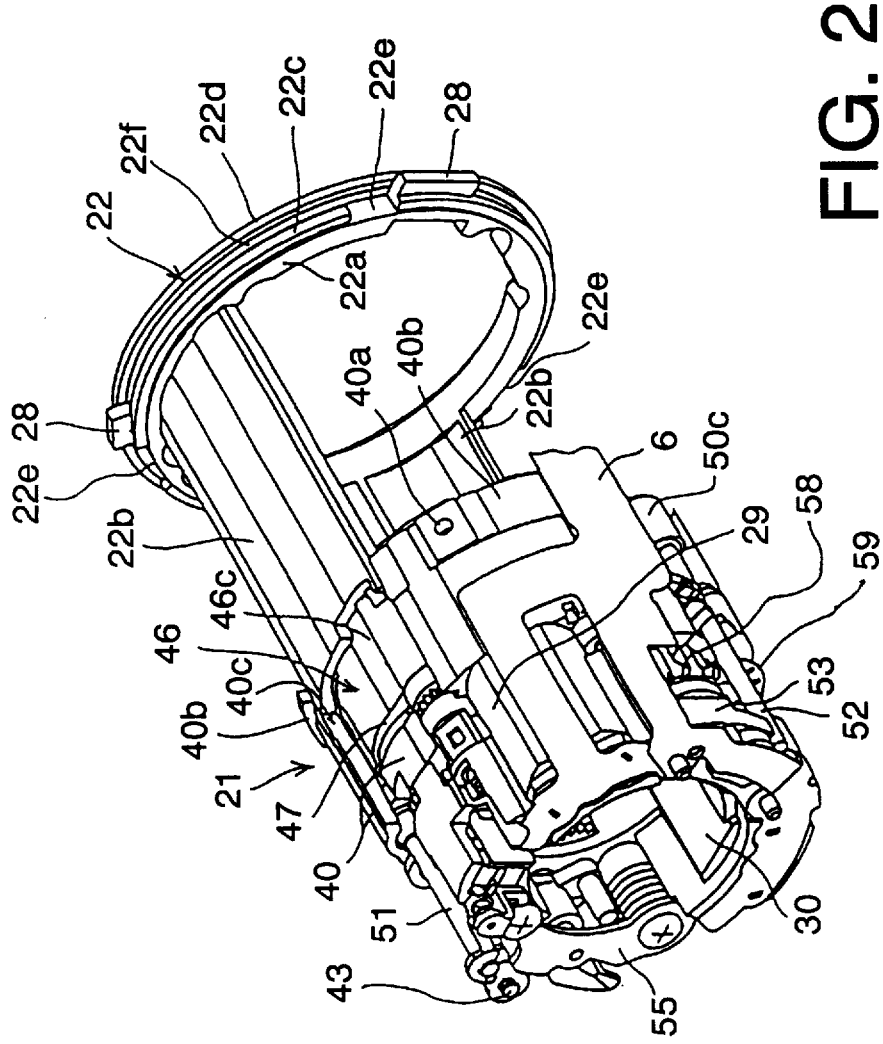
FIG. 2 is a schematic perspective view showing the part of the zoom lens barrel shown in FIG. 1 in an engaged state.
Figure 3:
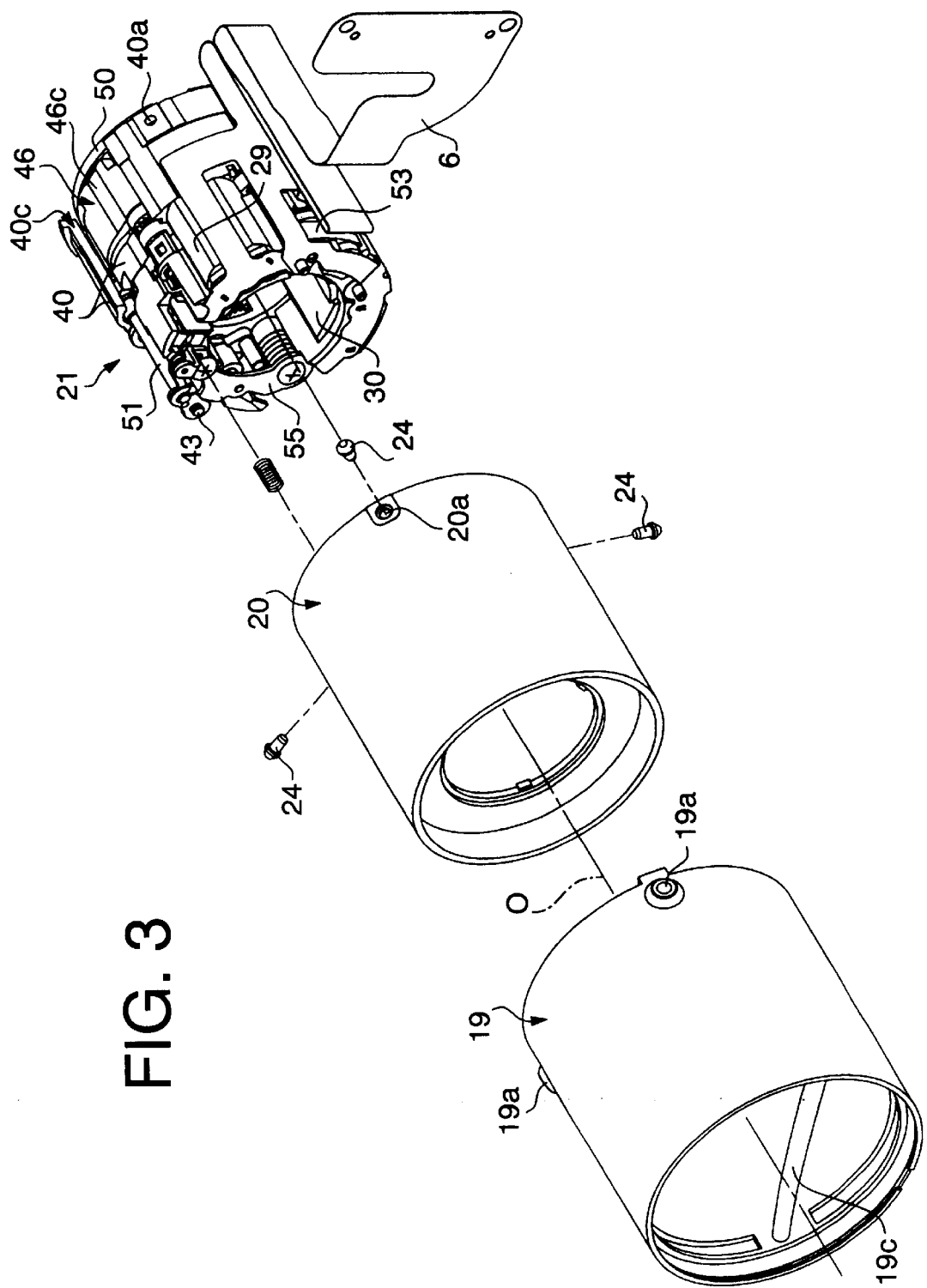
FIG. 3 is an enlarged exploded perspective view showing a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first movable barrel 20 and the AF/AE shutter unit 21.

The annular member 22a of the linear guide member 22 is connected to the rear of the second movable barrel 19, such that the linear guide member 22 and the second movable barrel 19 are capable of moving along the optical axis O as a whole, and in addition are capable of relatively rotating around the optical axis O. The linear guide member 22 is further provided, on the outer periphery of the rear end thereof, with a rear end flange 22d. The linear guide member 22 is further provided, in front of the rear end flange 22d, with an anti-dropping flange 22c. A circumferential groove 22f is formed between the rear end flange 22d and the anti-dropping flange 22c. The anti-dropping flange 22c has a radius smaller than the rear end flange 22d. The anti-dropping flange 22c is provided with a plurality of cutout portions 22e, as shown in FIG. 1 or 2, each allowing a corresponding engaging projection 19b to be inserted into the circumferential groove 22f, as shown in FIG. 9.

The second movable barrel 19 is provided, on an inner periphery of the rear end thereof, with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second movable barrel 19 relative to the linear guide member 22, the engaging projections 19b are engaged with the linear guide member 22. With the above structure, when the second movable barrel 19 rotates in the forward or reverse rotational direction, the first movable barrel 20 moves linearly, forwardly or rearwardly along the optical axis O, but is restricted from rotating.

Figure 8:
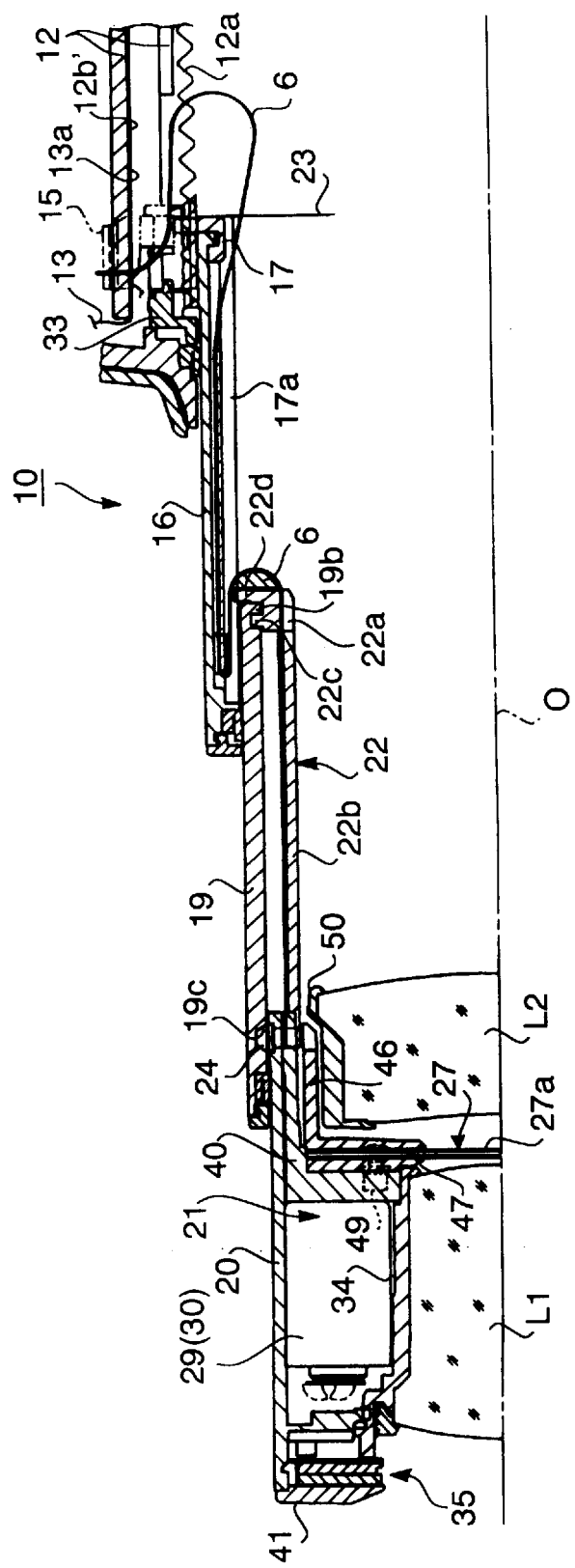
FIG. 8 is a sectional view of an upper part of the zoom lens barrel in a maximum extended state.

At the front of the first movable barrel 20, a barrier apparatus 35 having barrier blades 48a and 48b is mounted. On an inner peripheral face of the first movable barrel 20 the AF/AE shutter unit 21 having the shutter 27, consisting of three shutter blades 27a, is engaged and fixed, as shown in FIG. 8. The AF/AE shutter unit 21 is provided with a plurality of fixing holes 40a formed at even angular intervals on the outer periphery of the shutter mounting stage 40. Only one of the fixing holes 40a appears in each of FIGS. 1 through 5.

Figure 4:
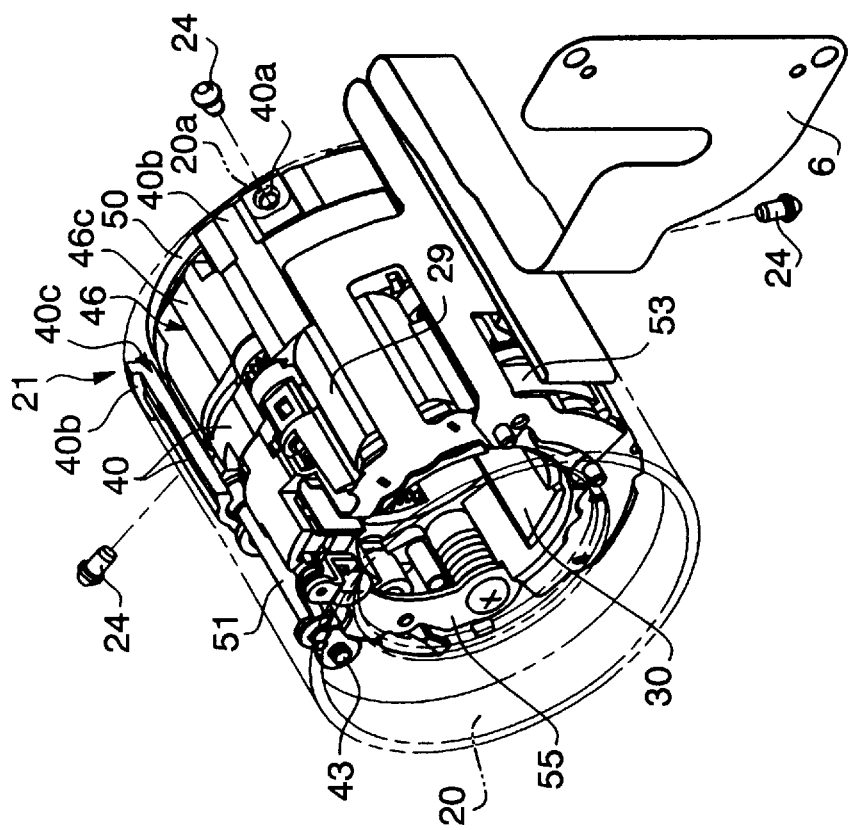
FIG. 4 is a schematic perspective view illustrating a state where an AF/AE shutter unit of the zoom lens barrel is mounted to a first movable barrel.

The aforementioned plurality of follower pins 24, which engage with the inner lead grooves 19c, also serve as device for fixing the AF/AE shutter unit 21 to the first movable barrel 20. The follower pins 24 are inserted and fixed in holes 20a, formed on the first movable barrel 20, and in the fixing holes 40a. With this arrangement the AF/AE shutter unit 21 is secured to the first movable barrel 20 as shown in FIG. 4. In FIG. 4 the first movable barrel 20 is indicated by phantom lines. The follower pins 24 may be fixed by an adhesive, or the pins 24 may be formed as screws to be screwed into the fixing holes 40a.

Figure 5:
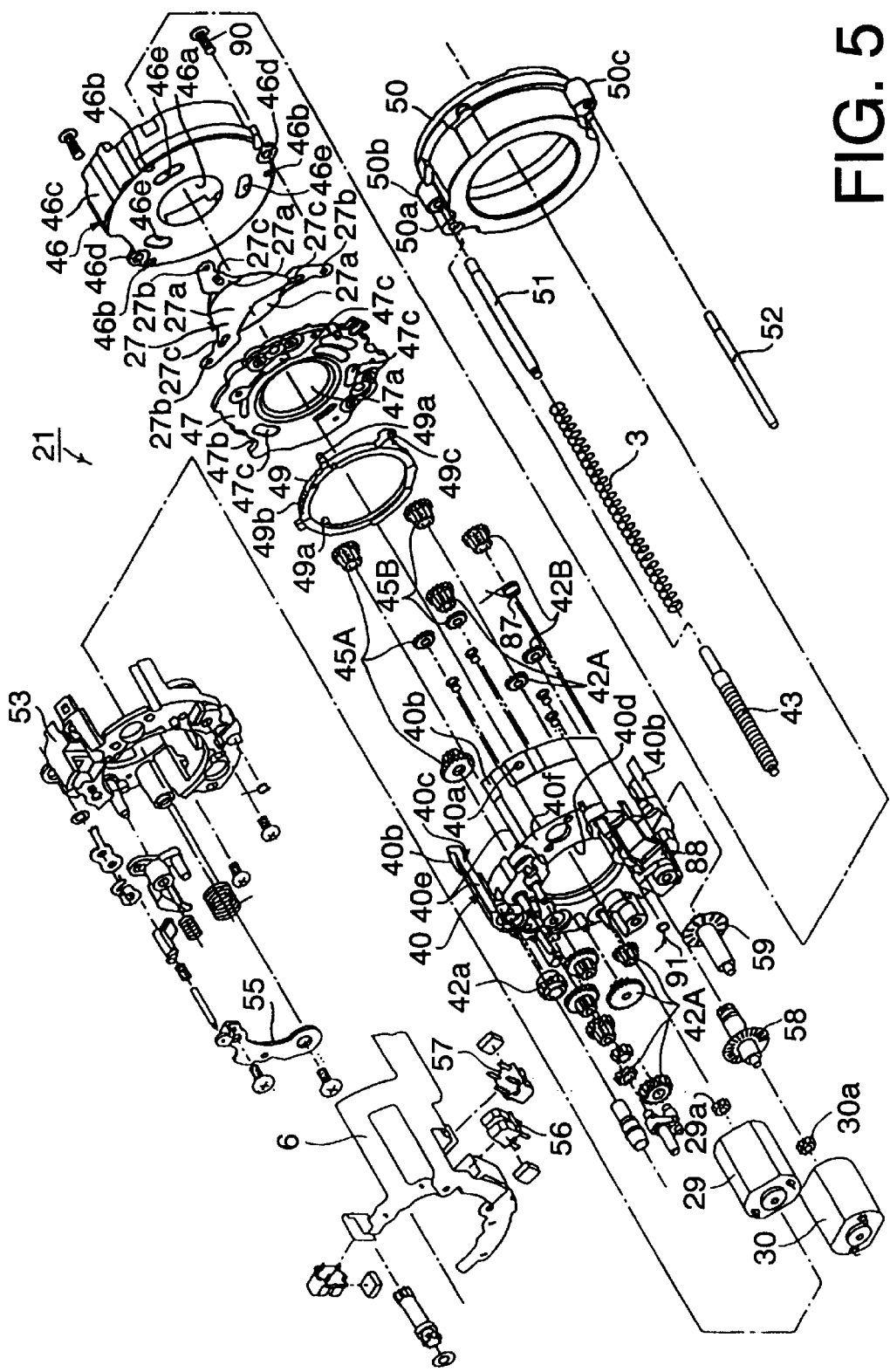
FIG. 5 is an exploded perspective view illustrating main parts of the AF/AE shutter unit of the zoom lens barrel.

As illustrated in FIGS. 5 and 10, the AF/AE shutter unit 21 is provided with the shutter mounting stage 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. On the shutter mounting stage 40, the lens supporting barrel 34, the AE motor 29, and the rear lens group driving motor 30, are supported. The shutter mounting stage 40 is provided, with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22, so as to guide the movement of the linear guide member 22.

The shutter mounting stage 40 supports an AE gear train 45 which transmits a rotation of the AE motor 29 to the shutter 27, a lens driving gear train 42, which transmits rotation of the rear lens group driving motor 30 to a screw shaft 43, photointerrupters 56 and 57, connected to a flexible printed circuit board 6, and rotating disks 58 and 59, having a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the shutter blade supporting ring 46 is provided, at a front end thereof, with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 10) at respective positions opposite the three supporting holes 46b. Each shutter blade 27a is provided at one end thereof with a hole 27b into which the corresponding pivotal shaft 47b is inserted, so that each shutter blade 27a is rotatable about the corresponding pivotal shaft 47b. The major part of each shutter blade 27a, that extends normal to the optical axis O from the pivoted end, is formed as a light-interceptive portion. All three light-interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the light-interceptive portion thereof, with a slot 27c, through which the corresponding operating projection 49a is inserted. The supporting member 47 is fixed to the shutter blade supporting ring 46 in such a manner that, each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46d provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole of the driving gear 42a. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws (not shown). The motors 29, 30 and the photointerrupters 56, 57 are connected to the flexible printed circuit board 6. One end of the flexible printed circuit board 6 is fixed to the shutter mounting stage 40.

After the first, second and third movable barrels 20, 19 and 16, and the AF/AE shutter unit 21 and the like are assembled, the aperture plate 23 is fixed to the rear of the linear guide barrel 17, and a supporting member 33 having a circular shape is fixed at the front of the fixed lens barrel block 12.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens group.

In addition, in the above embodiment, the rear lens group L2 is supported on the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized in such a manner that the rear lens group L2 is not supported by the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

The operation of the zoom lens barrel 10, by rotation of the whole optical unit driving motor 25 and the rear lens group driving motor 30, will now be described with reference to FIGS. 8 and 9.

Figure 9:
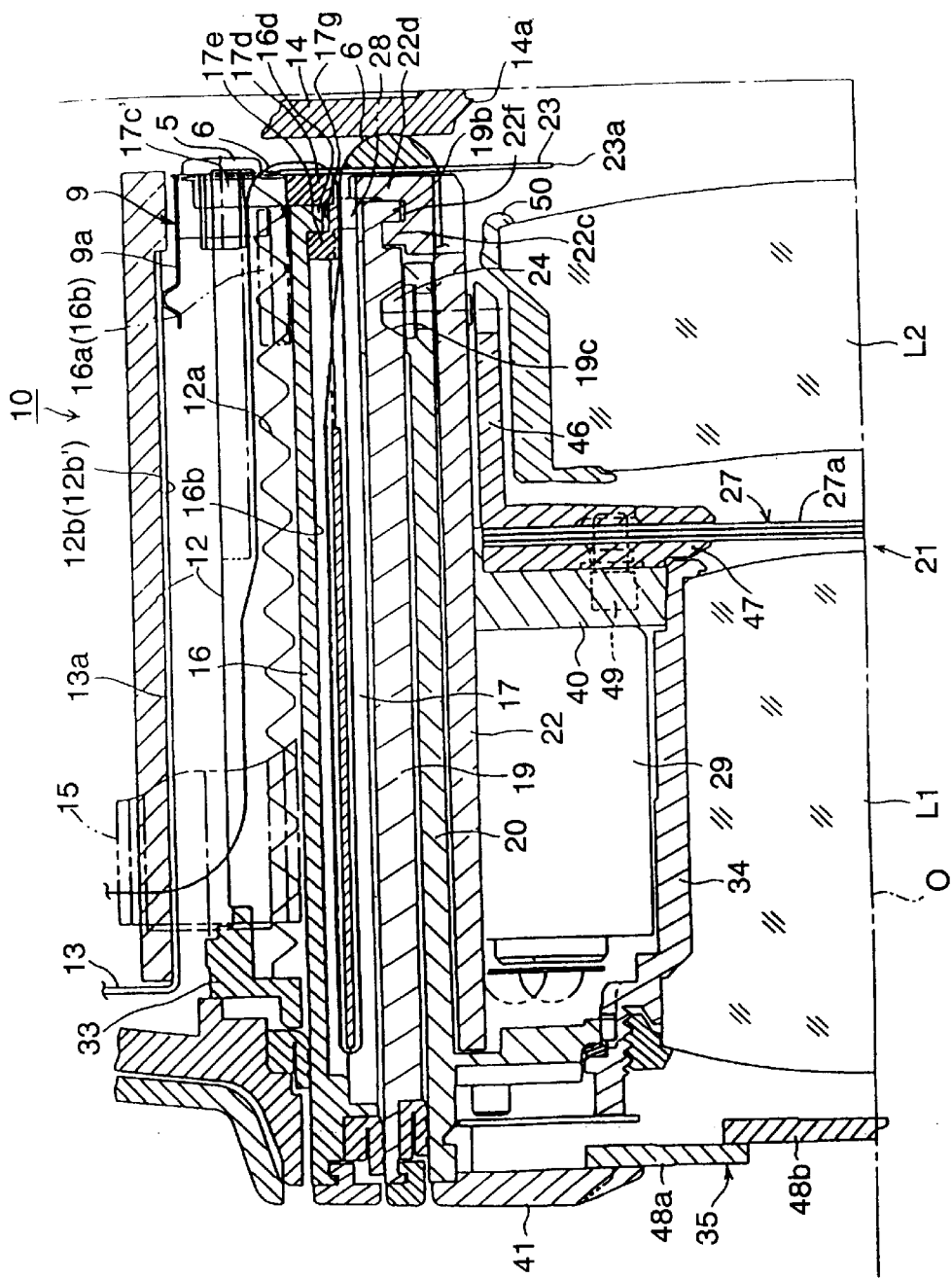
FIG. 9 is a sectional view of an upper part of the zoom lens barrel in a housed state.

As shown in FIG. 9, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 formed integral with the fixed lens barrel block 12, to thereby rotate the third movable barrel 16 in one predetermined rotational direction to advance forwardly along the optical axis O. Therefore, the second movable barrel 19 and the first movable barrel 20 are each advanced by a small amount in the optical axis direction, along with the third movable barrel 16. Consequently, the camera is in a state capable of photographing, with the zoom lens positioned at the widest position, i.e., the wide end. At this stage, due to the fact that the amount of movement of the linear guide barrel 17, with respect to the fixed lens barrel block 12, is detected through the relative slide between the code plate 13a and the contacting terminal 9, the focal length is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60, so that the third movable barrel 16 rotates in the rotational direction to advance along the optical axis C via the driving pinion 15 and the outer peripheral gear 16b. Therefore, the third movable barrel 16 is advanced from the fixed lens barrel block 12, according to the relationship between the female helicoid 12a and the male helicoid 16a. At the same time, the linear guide barrel 17 moves forwardly along the optical axis O together with the third movable barrel 16, without relative rotation to the fixed lens barrel block 12, according to the relationship between the engaging projections 17c and the linear guide grooves 12b. At this time, the simultaneous engagement of the follower pins 18 with the respective lead slots 17b and linear guide grooves 16c causes the second movable barrel 19 to move forwardly relative to the third movable barrel 16 in the optical axis direction, while rotating together with the third movable barrel 16 in the same rotational direction relative to the fixed lens barrel block 12. The first movable barrel 20 moves forwardly along the optical axis O together with the AF/AE shutter unit 21, from the second movable barrel 19, without relative rotation to the fixed lens barrel block 12, due to the above-noted structures in which the first movable barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60, so that the third movable barrel 16 rotates in the rotational direction to retract into the fixed lens barrel block 12 together with the linear guide barrel 17. At the same time, the second movable barrel 19 is retracted into the third movable barrel 16, while rotating in the same direction as that of the third movable barrel 16, and the first movable barrel 20 is retracted into the rotating second movable barrel 19 together with the AF/AE shutter unit 21. During the above retraction driving, like the case of advancing driving as above described, the rear lens group driving motor 30 is not driven.

While the zoom lens barrel 10 is driven during the zooming operation, since the rear lens group driving motor 30 is not driven, the front lens group L1 and the rear lens group L2 move as a whole, maintaining a constant distance between each other, as shown in FIG. 8. The focal length input via the zoom code plate 13a and the contacting terminal 9 is indicated on an LCD panel (not shown) provided on the camera body.

At any focal length, when the release button is depressed by a half-step, the object distance measuring apparatus 64 is actuated to measure an object distance. At the same time the photometering apparatus 65 is actuated to measure an object brightness. Thereafter, when the release button is fully depressed, the whole optical unit driving motor 25 and the rear lens group driving motor 30 are each driven by respective amounts each corresponding to the focal length information set in advance and the object distance information obtained from the object distance measuring apparatus 64, so that the front and rear lens groups L1 and L2 are respectively moved to specified positions to obtain a specified focal length and also bring the object into focus. Immediately after the object is brought into focus, via the AE motor controller 66, the AE motor 29 is driven to rotate the circular driving member 49 by an amount corresponding to the object brightness information obtained from the photometering apparatus 65, so that the shutter 27 is driven to open the shutter blades 27a by a predetermined amount which satisfies the required exposure. Immediately after the three shutter blades 27a are opened and subsequently closed, the whole optical unit driving motor 25 and the rear lens group driving motor 30 are both driven to move the front lens group L1 and the rear lens group L2 to respective initial positions at which they were at prior to a shutter release.

The arrangement of a focal length detecting device will now be described in detail with reference to FIGS. 12–18.

As described above, in order to connect the linear guide barrel 17 and the fixed lens barrel block 12, the rear end flange 17d of the linear guide barrel 17 includes a plurality of engaging projections 17c each projecting away from the optical axis O in a radial direction. The rotation of the linear guide barrel 17 relative to the fixed lens barrel block 12 is restricted by the slidable engagement of the plurality of engaging projections 17c with the corresponding plurality of linear guide grooves 12b on the fixed lens barrel block 12.

A predetermined linear guide groove 12b is selected as a code plate guide groove 12b' and a corresponding engaging projection 17c functions as a contact projection 17c'. The code plate guide groove 12b', has a U-shaped cross-section and is open at the forward end to allow insertion of the code plate 13a and the contact projection 17c' during assembly. The contacting terminal (brush member) 9 is fixed to the contact projection 17c' and the code plate 13a is secured to the bottom of the code plate guide groove 12b'. Thus, when the linear guide barrel 17 is assembled with the fixed lens barrel block 12, the contacting terminal 9 is in sliding contact with the code plate 13a. The sliding contact between the contacting terminal 9 and the predetermined code pattern of the code plate 13a generates a signal corresponding to the focal length, as described hereinafter.

In particular, the contacting protrusion 17c', as shown in FIGS. 13–16, includes a protruding part 70, that protrudes in the radial direction, a mounting screw hole 71, which is formed centrally in the protruding part 70 parallel to the optical axis O, and two positioning protrusions 72, positioned on opposite sides of the mounting screw hole 71, which protrude towards the rear of the camera.

As shown in FIGS. 13–17, the contacting terminal 9 is provided with a connecting part 9b, a through hole 9c, formed on the connecting part 9b, which corresponds with the mounting screw hole 71, and two positioning holes 9d, which fit with the two positioning protrusions 72. The contacting terminal 9 is attached to the radially protruding part 70 of the contact protrusion 17c' by a fixing screw 5 that is inserted through the through hole 9c and screwed to the mounting screw hole 71. If the through hole 9c is formed somewhat larger in diameter than the thread part (shank) of the fixing screw 5 and the positioning holes 9d are formed somewhat larger in diameter than the positioning protrusions 72, the position of the contacting terminal 9 can be adjusted vertically and horizontally before tightening the fixing screw 5. In particular, the adjustment of the contacting terminal 9 is facilitated by interposing a washer or the like at the shank of the fixing screw 5.

The contacting terminal 9 is also provided with brush parts 9a, which are substantially perpendicular to the connecting part 9b and which are in sliding contact with the code plate 13a. The brush parts 9a are electrically continuous to each other.

Figure 12:
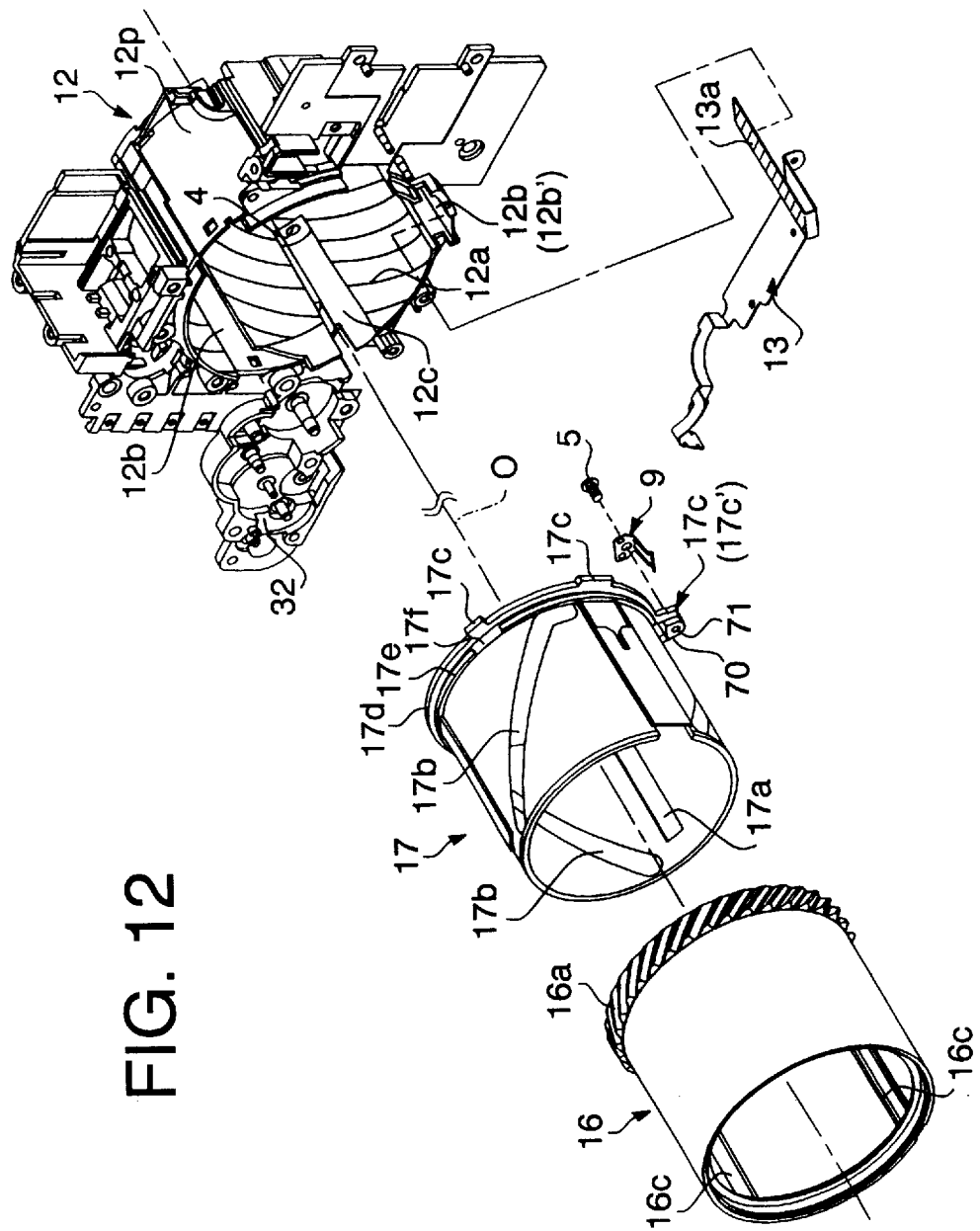
FIG. 12 is an exploded perspective view showing several major parts of the zoom lens barrel.
Figure 13:
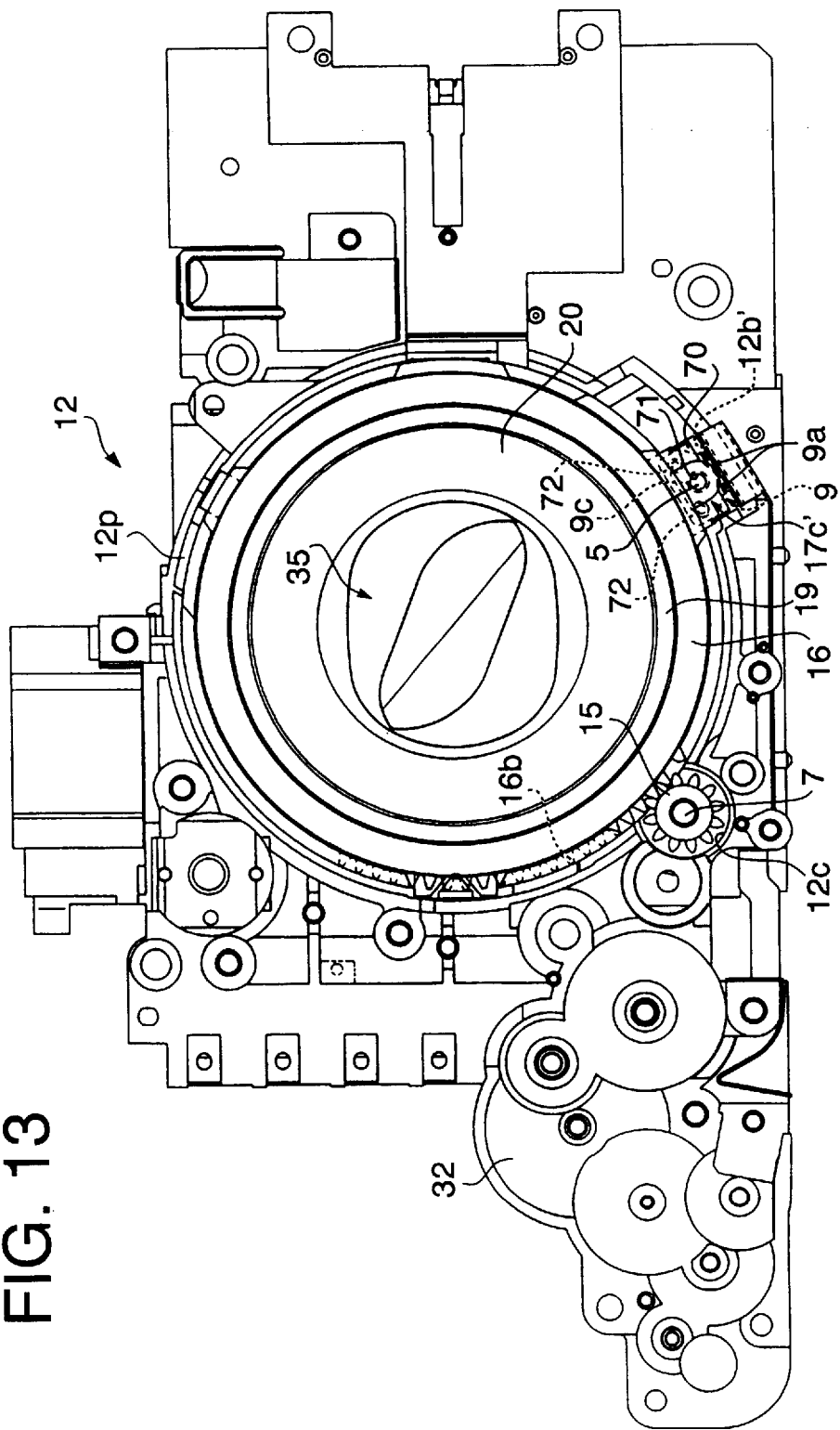
FIG. 13 is a front view of a fixed lens barrel block with a contacting terminal and a code plate installed.
Figure 14:
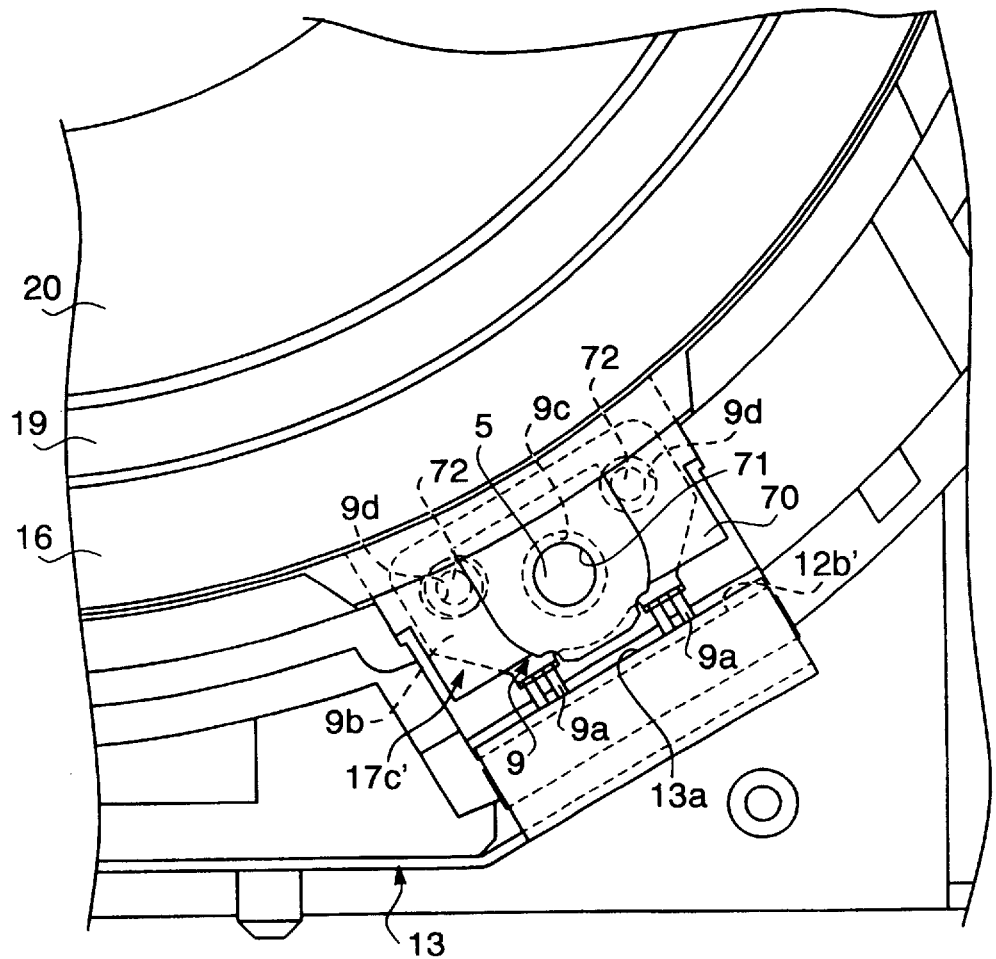
FIG. 14 is an enlarged view of the fixed lens barrel block of FIG. 13.
Figure 17:
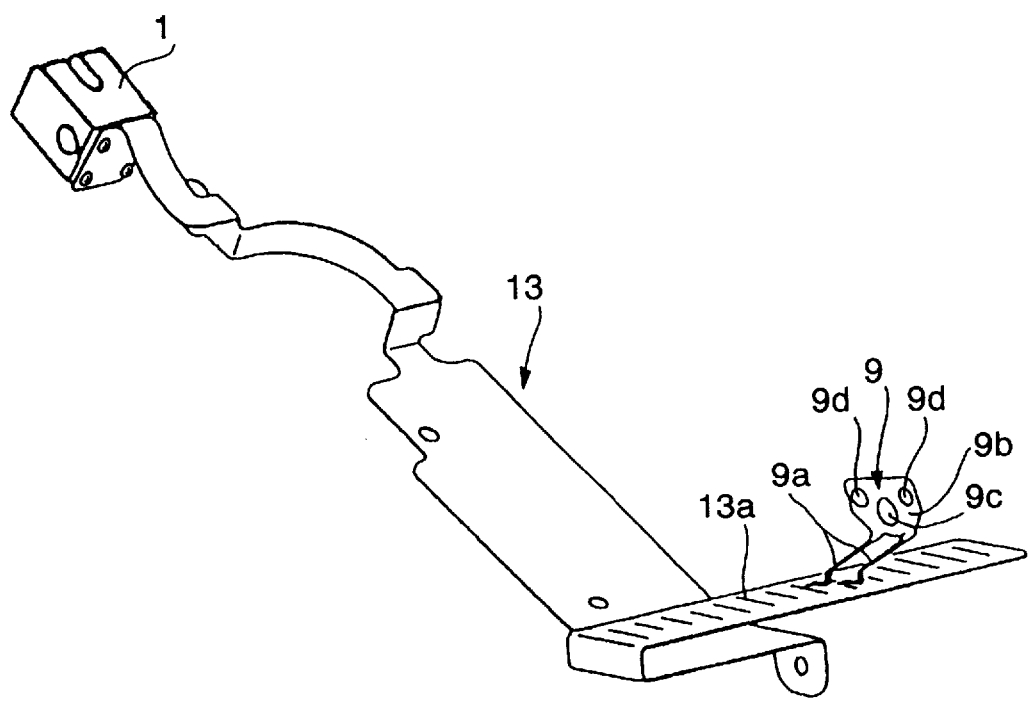
FIG. 17 is an enlarged perspective view of the contacting terminal and the code plate.

As described above, the code plate 13a is a part of a flexible printed circuit board 13. As shown in FIG. 12, the flexible printed circuit board 13 is formed such that the code plate 13a is inserted into the code plate guide groove 12b' while the remainder of the flexible printed circuit board 13 extends around the outside of the fixed lens barrel block 12. As shown in FIG. 17, the part of the flexible printed circuit board 13 that is outside of the fixed lens barrel block 12 is attached to a photointerrupter 1. The photointerrupter 1 is a part of an encoder (not shown) used to sense the state of the whole optical unit driving motor 25 and the photointerrupter 1 is connected to a CPU (not shown) through the flexible printed circuit board 13.

Figure 18:
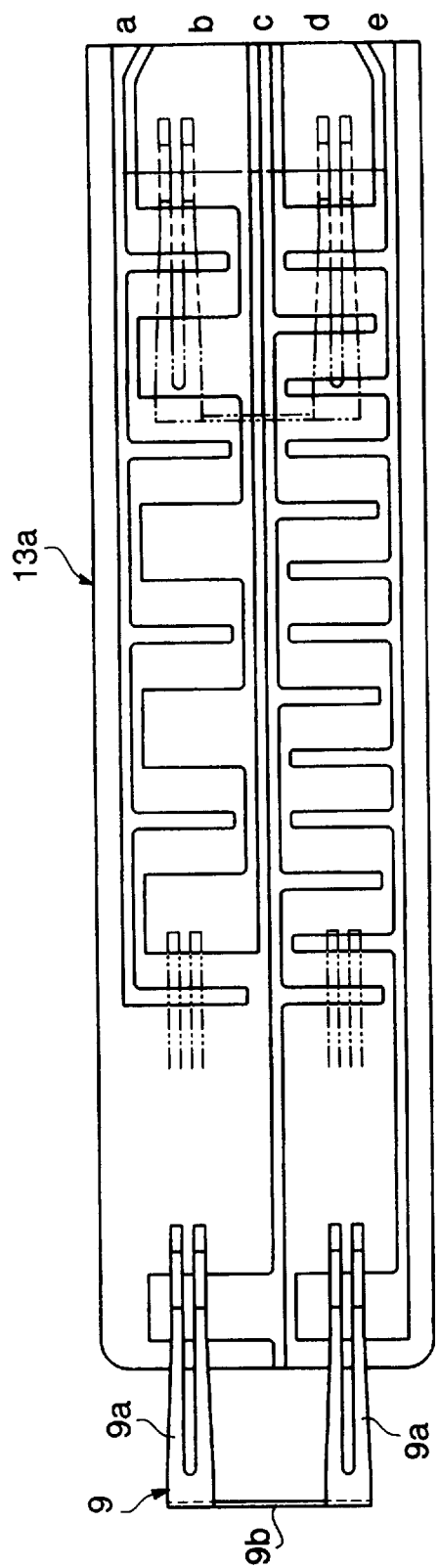
FIG. 18 is an enlarged plan view of the contacting terminal and the code plate.

As shown in FIG. 18, the code plate 13a is provided with five electrodes a–e (circuit patterns), which are arranged parallel to the optical axis O. These electrodes a–e are formed in predetermined patterns such that as the brush parts 9a slide along the code plate 13a parallel to the optical axis, the brush parts 9a cause predetermined sets of the electrodes to be in contact with each other to thereby cause a predetermined signal (position information/focal length information) to be output to a controller (not shown).

Figure 15:
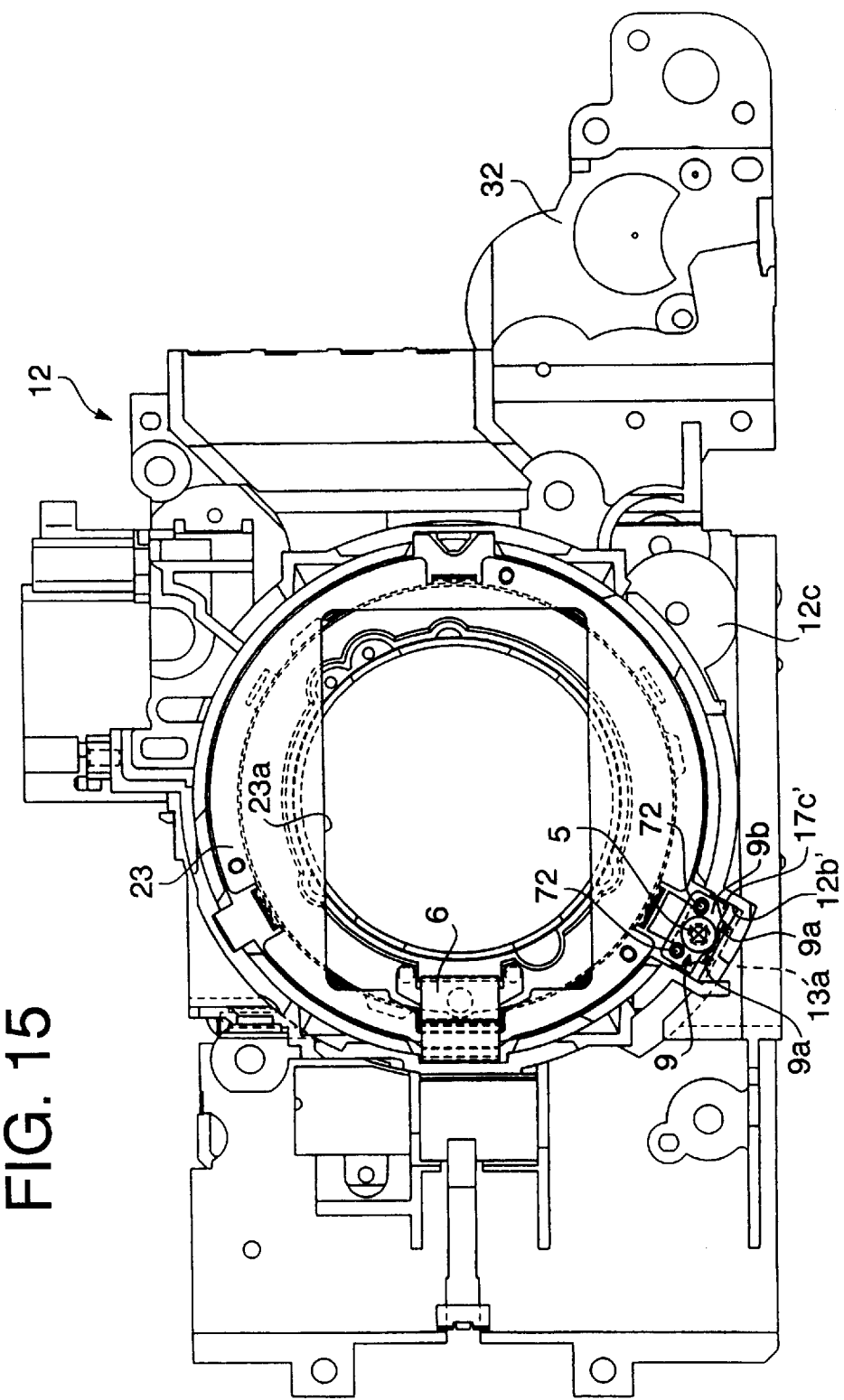
FIG. 15 is a rear view of the fixed lens barrel block of FIG. 13.
Figure 16:
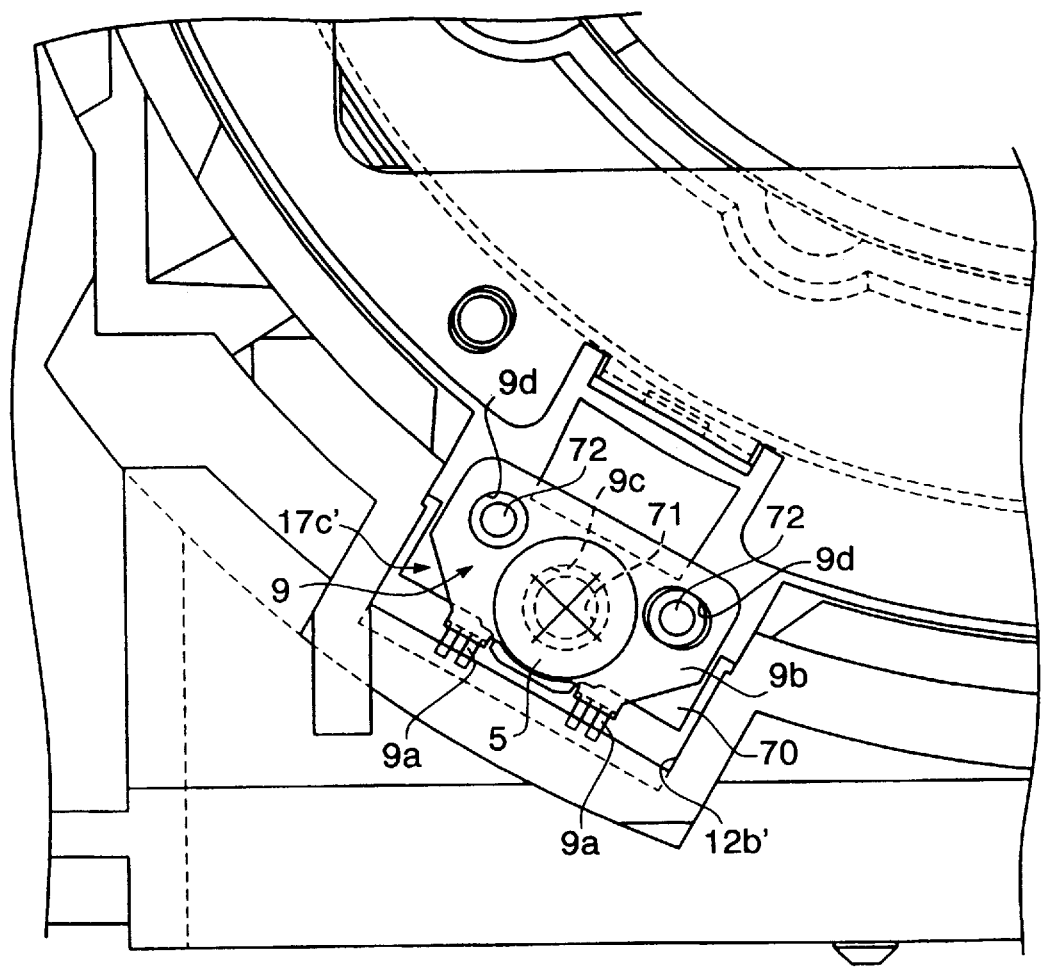
FIG. 16 is an enlarged view of the fixed lens barrel block of FIG. 15.

As shown in FIG. 15, after the contacting terminal 9 is installed, the aperture plate 23 is fixed to the rear end face of the linear guide barrel 17.

In the arrangement of the contacting terminal 9 and the code plate 13a described above, the contacting terminal 9 and the code plate 13a are provided in the space that is used by one of the linear guide grooves 12b in order to minimize the total amount of space used. Further, if the code plate guide groove 12b' is positioned at or near a corner of the rectangular-shaped aperture 23a (see FIG. 15), the code plate guide groove 12b' can make use of otherwise unused space (i.e. "dead space") such that the size of the camera is reduced.

Furthermore, since the contacting terminal 9 is fixed to the contact protrusion 17c', which is slidably fitted into the code plate guide groove 12b', the contacting terminal 9 is maintained in stable contact with the code plate 13a, and thus the position/focal length information is stable.

Also, since the contact protrusion 17c' is positioned at the rear end part of the linear guide barrel 17, the contacting terminal 9 can be fixed to the contact protrusion 17c' from the rear after the major parts of the zoom lens barrel 10 have been assembled onto the fixed lens barrel block 12. Thus, there is less chance of erroneously bending or otherwise damaging the brush part 9b during assembly of other components.

With the above arrangement, during movements of the lens barrels, as described above, the amount of advance or retreat (distance of advance or retreat) of the linear guide barrel 17 with respect to the fixed lens barrel block 12 is detected by the relative sliding of the contacting terminal 9 along the code plate 13a, the position of the front and rear lens groups L1 and L2 is determined, and the focal length of the zoom lens is determined.

Although the structure and operation of a zoom compact camera is described herein with respect to the preferred embodiments, many modifications and changes can be made without departing from the spirit and scope of the invention.

The present disclosure relates to subject matter contained in Japanese Patent Application Nos. HEI 08-012317, filed on Jan. 26, 1996 and HEI 08-017876, filed on Feb. 2, 1996 which are expressly incorporated herein by reference in their entirety.

What is claimed is:

1. A zoom compact camera comprising:

a camera body including a stationary barrel portion which is provided with a guide groove;

a movable barrel which is provided with a guide key that slidably engages with said guide groove for guiding said movable barrel;

a code plate which is fixed in said guide groove and;

a contacting terminal, provided on said guide key wich is in slidable contact with said code plate;

wherein a position of said movable barrel is detected based on a signal produced by the relative position of said contacting terminal with respect to said code plate.

2. The camera according to claim 1, wherein a zoom lens is mounted on said movable barrel and said zoom lens comprises a front lens group and a movable rear lens group, such that said rear lens group is movable, parallel to the optical axis, with respect to said front lens group.

3. The camera according to claim 1, wherein said code plate comprises a portion of a flexible printed circuit board, said flexible printed circuit board arranged such that a substantial portion of said flexible printed circuit board is positioned on the outer side of said stationary barrel portion.

4. The camera according to claim 3, wherein said flexible printed circuit board is connected to at least one component for providing an electrical connection.

5. The camera according to claim 4, wherein said electrical connection is provided for transferring camera-related information.

6. The camera according to claim 1,
wherein said guide key includes a protruding part, said protruding part protruding in a radial direction with respect to said movable barrel and said protruding part includes a fixing screw hole; and
wherein said contacting terminal includes a connecting part and a brush part, said connecting part including a through hole that corresponds with said fixing screw hole, such that the position of the contacting terminal in relation to the protruding part is adjustable to maintain said brush part in sliding contact with said code plate.

7. The camera according to claim 6, wherein said code plate comprises a portion of a flexible printed circuit board, said flexible printed circuit board being substantially positioned on the outer side of said stationary barrel portion.

8. The camera according to claim 7, wherein said flexible printed circuit board is connected to at least one component for providing an electrical connection.

9. The camera according to claim 8, wherein said electrical connection is provided for transferring camera-related information.

10. The camera according to claim 1, wherein said guide groove has a generally U-shaped cross-section.

11. The camera according to claim 10, wherein said code plate is provided along the base region of said guide groove.

12. The camera according to claim 1, wherein said guide groove is open at at least one end.

13. The camera according to claim 1, wherein said camera is further provided with an aperture plate that defines a rectangular-shaped aperture and said guide groove is provided proximate to a corner of said rectangular-shaped aperture.

14. The camera according to claim 1, wherein said guide key is provided at a rear part of said moving barrel.

15. The camera according to claim 1, wherein said stationary barrel portion is provided with a plurality of guide grooves and said movable barrel is provided with a plurality of guide keys that fit respectively with said plurality of guide grooves, and wherein said code plate is provided in one of said plurality of guide grooves and said contacting terminal is fixed to a corresponding one of said plurality of guide keys.

16. The camera according to claim 15, wherein said plurality of guide grooves are arranged around said stationary barrel portion at equiangular intervals.

17. The camera according to claim 1, wherein said guide groove is a linear guide groove.

18. A zoom compact camera comprising:
a camera body with a stationary barrel portion which is provided with a linear guide groove that is parallel to the optical axis;
a linear guide barrel which is provided with a guide key that slidably engages with said linear guide groove for guiding said linear guide barrel in the optical axis direction when said linear guide barrel moves;
a first rotatable movable barrel which is engaged with said stationary barrel portion and is coupled with an inner side of said linear guide barrel to be integrally movable parallel to the optical axis and rotatable about said linear guide barrel, such that, as said first rotatable movable barrel rotates in a forward or in a reverse direction, said first rotatable movable barrel and said linear guide barrel advance or retreat, respectively, parallel to the optical axis;
a second rotatable movable barrel which is engaged at the inner side of said linear guide barrel, such that as said first rotatable movable barrel rotates in a forward or in a reverse direction, said second rotatable movable barrel rotates and moves parallel to the optical axis, and advances from or retreats into said linear guide barrel in accordance with thr forward or reverse rotation directions, respectively;
a linearly movable barrel which is engaged at the inner side of said second rotatable movable barrel, such that, as said second rotatable movable barrel rotates in a forward or in a reverse direction, said linearly movable barrel moves parallel to the optical axis, and advances from or retreats into said second rotatable movable barrel in accordance with the forward or reverse rotation directions, respectively;
a zoom lens mounted on said linearly movable barrel, said zoom lens comprising a front lens group and a rear lens group, such that said rear lens group is movable, parallel to the optical axis, with respect to said front lens group; and
a code plate which is fixed to said linear guide groove; and
a contacting terminal which is fixed to said guide key to be in slidable contact with said code plate;
wherein a focal length of said zoom lens is detected based on a signal produced by the relative position of said contacting terminal with respect to said code plate.

19. The camera according to claim 18, wherein said code plate comprises a portion of a flexible printed circuit board, said flexible printed circuit board being positioned substantially on the outer side of said stationary barrel portion.

20. The camera according to claim 19, wherein said flexible printed circuit board is connected to at least one component for providing an electrical connection.

21. The camera according to claim 20, wherein said electrical connection is provided for transferring camera-related information.

22. The camera according to claim 18, wherein said guide key is provided at a rear part of said linear guide barrel.

23. The camera according to claim 22, wherein said code plate is a part of a flexible printed circuit board, said flexible printed circuit board having a substantial portion positioned on the outer side of said stationary barrel portion.

24. The camera according to claim 23, wherein said flexible printed circuit board is connected to at least one component for providing an electrical connection.

25. The camera according to claim 24, wherein said electrical connection is provided for transferring camera-related information.

26. The camera according to claim 18, wherein said linear guide groove has a generally U-shaped cross-section.

27. The camera according to claim 26, wherein said code plate is provided along the base region of said linear guide groove.

28. The camera according to claim 18, wherein said linear guide groove is open at at least one end.

29. The camera according to claim 18, wherein said camera is further provided with an aperture plate that defines a rectangular-shaped aperture and said linear guide groove is provided proximate to a corner of said rectangular-shaped aperture.

30. The camera according to claim 18, wherein said stationary barrel portion is provided with a plurality of linear guide grooves and said linear guide barrel is provided with a plurality of guide keys that fit respectively with said plurality of linear guide grooves and wherein said code plate is provided in one of said plurality of linear guide grooves and said contacting terminal is fixed to a corresponding one of said plurality of guide keys.

31. The camera according to claim 30, wherein said plurality of linear guide grooves are arranged around said stationary barrel portion at equiangular intervals.

\* \* \* \* \*

UNITED STATES PATENT AND TRADEMARK OFFICE
CERTIFICATE OF CORRECTION

PATENT NO. : 5,809,348
DATED : September 15, 1998
INVENTOR(S) : H. NOMURA et al.

It is certified that error appears in the above-identified patent and that said Letters Patent is hereby corrected as shown below:

At column 14, line 63, (claim 1, line 8) of the printed patent, "key wich" should be —key, which—.

Signed and Sealed this

Thirtieth Day of November, 1999

Q. TODD DICKINSON

Attest:

Attesting Officer

Acting Commissioner of Patents and Trademarks